United States Patent [19]

Imazeki et al.

[11] 4,095,190

[45] June 13, 1978

[54] TUNING SYSTEM

[75] Inventors: Kazuyoshi Imazeki; Koichi Kazami, both of Tokyo, Japan

[73] Assignee: General Research of Electronics, Inc., Tokyo, Japan

[21] Appl. No.: 817,366

[22] Filed: Jul. 20, 1977

[51] Int. Cl.² ............................................. H03B 3/04
[52] U.S. Cl. ........................................ 331/2; 331/16; 331/31
[58] Field of Search ............... 331/2, 31, 16; 307/295; 328/155

[56] References Cited

U.S. PATENT DOCUMENTS 3,863,174   1/1975   Klinger .................................... 331/2

FOREIGN PATENT DOCUMENTS 588,739   12/1959   Canada ..................................... 331/2
1,139,776   1/1969   United Kingdom ..................... 331/2

*Primary Examiner*—John Kominski
*Attorney, Agent, or Firm*—Olson, Trexler, Wolters, Bushnell & Fosse, Ltd.

[57] ABSTRACT

A system is disclosed for generating a plurality of preselected frequencies in a radio frequency device such as a receiver, transmitter or transceiver. It comprises two crystal-controlled reference signal oscillators. First and second controllable variable-frequency oscillators (VCO's), first and second mixers, and a programmable frequency divider, together generate first and second output signals, with the first mixer being coupled to the first crystal oscillator and to the first VCO to generate the first output signal having a frequency corresponding to the difference between the frequency of the first reference signal and that of the first VCO. The second mixer is coupled to the second crystal oscillator and to the second VCO to generate the second output signal which has a frequency corresponding to the difference between the frequency of the second reference signal and the frequency of the second VCO. A phase comparator is selectively coupled to the mixers by a switch for selectively comparing the first reference signal with one of the output signals and developing a corresponding control signal which varies systematically in accordance with the frequency difference therebetween, with the control signal being applied to both VCO's to vary the oscillation frequencies thereof until the frequency of the selected output signal is substantially equal to the predetermined frequency of the first reference signal, whereby the output signal of the corresponding VCO has a frequency which corresponds to one of the plurality of predetermined receiver frequencies as selected by both the programmable frequency divider and the mixer output signal selected by the switch.

6 Claims, 1 Drawing Figure

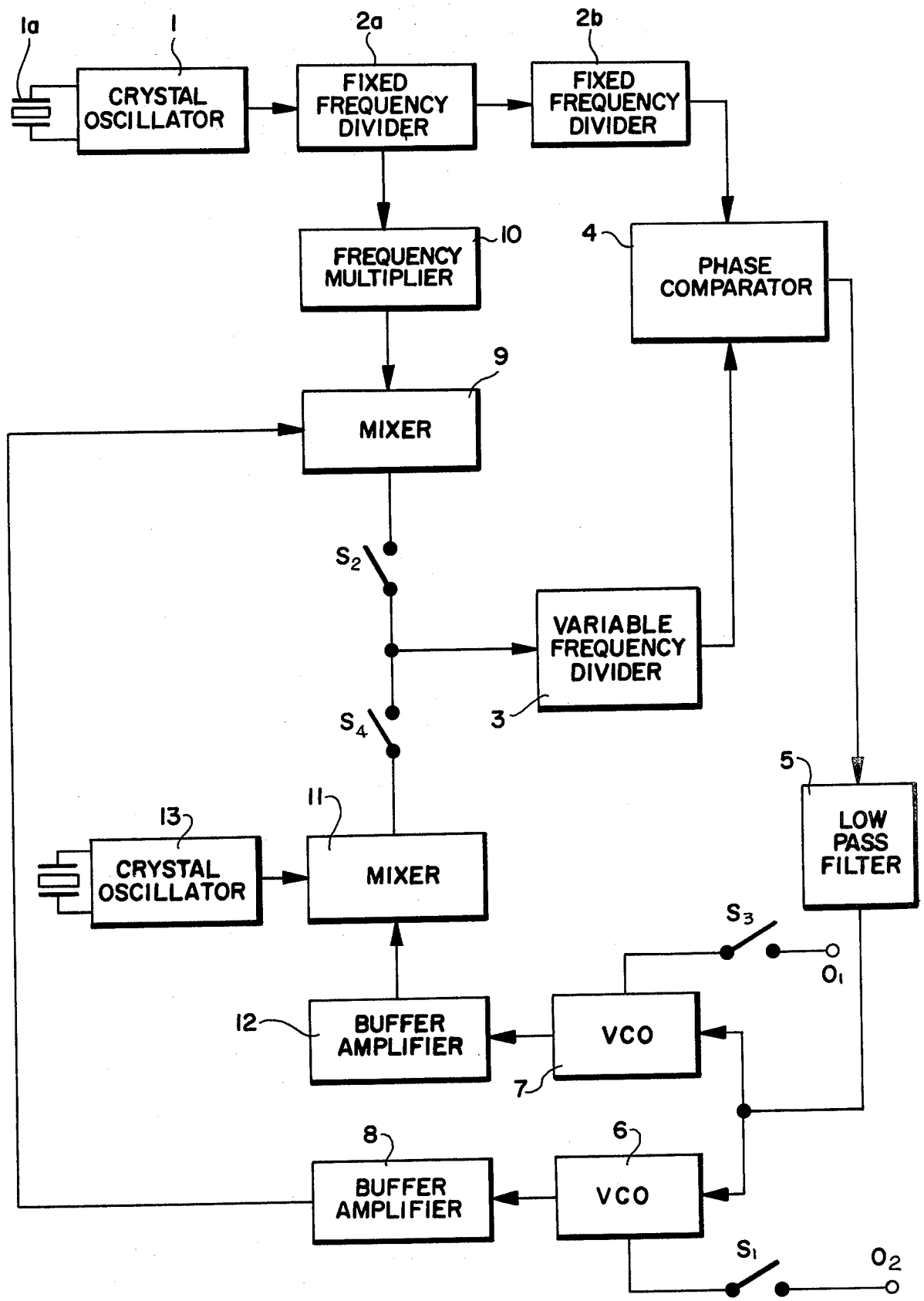

TUNING SYSTEM

BACKGROUND OF THE INVENTION

The present invention relates to tuning systems for radio frequency devices such as radio transmitters and receivers and, more particularly, to improvements in such systems which are particularly adapted for use in a radio transceiver.

In conventional radio receivers, the tuning is often accomplished by a superheterodyne circuit; that is, one in which a mixer combines or "beats" an incoming radio-frequency signal with an internally-generated ("local oscillator") frequency to obtain a difference signal which is applied to the intermediate frequency (IF) circuitry of the receiver in a well-known manner. In some receivers, more than one mixer-local oscillator stage is employed and two intermediate frequencies are thus produced (e.g., 10.7 MHz and 455 KHz). The frequency of the local oscillator typically is made variable by a user-operable control to thus permit tuning of the receiver to various desired radio frequencies.

One particular type of local oscillator tuning system employs the well-known phase-locked-loop (PLL) technique in a tuning system which has sometimes been referred to as the "homodyne" or "synchrodyne" circuit. Although these circuits have been known and used for at least 35 years, the relatively high cost thereof had made them unfeasible for most commercial radio devices. More recently, however, integrated circuit (IC) technology has revitalized and refined the phase-locked-loop technique to the point where it has become quite attractive for use in modern radio frequency devices, particularly where it is desired to tune to a plurality of frequencies with a relatively high degree of precision.

In general, the phase-locked-loop is a feedback system composed of four basic elements: a phase detector or comparator, a low-pass filter, a voltage-controlled oscillator, and a feedback loop containing a frequency divider. In operation, a reference signal having a fixed frequency (often crystal-controlled for stability) is applied to one input of a phase detector and a second signal having a frequency relatively close to that of the reference signal is applied to the second input of the phase comparator. The phase comparator produces an output signal having a voltage that is proportional to the phase difference between the frequency of the reference signal and the frequency of the other signal. The output signal of the phase detector is filtered by a low-pass filter to obtain a DC error signal which is applied to the voltage-controlled oscillator to adjust its frequency. This frequency is applied, by means of the frequency divider, back to the second input of the phase comparator.

Thus, the frequency of the voltage controlled oscillator is changed until it reaches that frequency which, when divided by the divider in the feedback loop, equals the frequency of the reference signal, at which point it is locked in. In so-called frequency synthesizer circuits employing the PLL technique, the divider is made variable or programmable in a predetermined fashion so that a number of predetermined frequencies can be generated with considerable accuracy.

Such circuitry is well-known and reference may be had, for example, to the Apr. 11, 1968 issue of *Electronic Design* (pages 76–80); pages 52 and 53 of Floyd M. Gardner's book entitled "Phase Lock Techniques", John Wiley & Sons Inc., 1966; and U.S. Pat. No. 4,013,957 to Tojo. As shown in the 4,013,957 patent, for example, similar techniques also may be utilized in radio transceiver circuitry to produce the carrier frequency which is modulated by the information signal.

Although the recent developments in integrated circuit technology have greatly reduced the cost of phase-locked-loop circuits and have therefore made them quite popular in tuning systems for multi-channel radio receivers, transmitters, and transceivers, it is still desirable to simplify and further reduce the cost of such tuning systems. Moreover, it is desirable to reduce the amount of spurious signals, especially during transmission and without the need for special filter networks.

It is therefore an object of the invention to provide a new and improved tuning system for radio frequency devices.

It is another object of the invention to provide such a new and improved system which is highly adaptable to radio frequency receivers, transmitters, and transceivers to simplify the circuitry and reduce the costs thereof.

It is yet another object of the invention to provide such a tuning system which reduces spurious signal generation.

SUMMARY OF THE INVENTION

A system for generating a plurality of preselected frequencies in a radio frequency device comprises means for generating a first reference signal having a predetermined frequency and means for generating a second reference signal having a predetermined frequency. Means, including first and second controllable variable-frequency oscillators, first and second mixers, and a programmable frequency divider, are provided for generating first and second output signals, with the first mixer being coupled to the first reference signal generating means and to the first variable-frequency oscillator to generate the first output signal having a frequency corresponding to the difference between the frequency of the first reference signal and the frequency of the first variable-frequency oscillator, and with the second mixer being coupled to the second reference signal generating means and to the second variable-frequency oscillator to generate the second output signal having a frequency corresponding to the difference between the frequency of the second reference signal and the frequency of the second variable-frequency oscillator. Means coupled to the first reference signal generating means and selectively coupled to the first and second mixers by a switch and selectively responsive to the first and second output signals are provided for selectively comparing the first reference signal with the first output signal and the first reference signal with the second output signal and developing a corresponding control signal which varies systematically in accordance with the frequency difference therebetween, with the control signal being applied to both controllable variable-frequency oscillators to vary the oscillation frequencies thereof until the frequency of the selected output signal is substantially equal to the predetermined frequency of the first reference signal, whereby the output signal of the corresponding controllable oscillator has a frequency which corresponds to one of the plurality of predetermined receiver frequencies as selected by both the programmable frequency divider and the mixer output signal selected by the switch.

The features of the present invention which are believed to be novel are set forth with particularity in the appended claims. The organization and manner of operation of the invention, together with further objects and advantages thereof, may best be understood by reference to the following description taken in connection with the accompanying drawing in which the drawing is a block diagram, partially in schematic diagram form, of a preferred embodiment of a tuning system constructed in accordance with the principles of the present invention.

DESCRIPTION OF THE PREFERRED EMBODIMENT

With respect to the figure, there is shown a system for generating a plurality of preselected frequencies in a radio frequency device. Means in the form of a crystal-controlled oscillator 1 are provided for generating a first reference signal having a predetermined frequency. For example, the frequency of oscillator 1 could be selected to be 10.24 megahertz when the invention is utilized in a citizen's band transceiver embodiment. Similarly, means in the form of a crystal-controlled oscillator 13 are provided for generating a second reference signal having a predetermined frequency (e.g., 26.055 MHz). It is understood, of course, that while the invention is described particularly with reference to a citizen's band transceiver, the principles involved may be applied to various types of radio frequency devices such as multi-band receivers or transmitters, for example. In the particular embodiment of the invention illustrated, a fixed frequency divider 2a is provided to divide the frequency of the reference signal in half whereupon a frequency multiplier triples the frequency to obtain a frequency that is applied to a first mixer 9 which is one and one-half times the frequency of crystal oscillator 1.

Means including first and second controllable variable frequency oscillators 6 and 7, first and second mixers 9 and 11, and frequency divider 3 are provided for generating first and second reference signals. In the illustrated embodiment, oscillators 6 and 7 may take the form of conventional voltage-controlled oscillators (VCO). The first mixer 9 is coupled to the first crystal oscillator 1, by the aforesaid frequency divider and multiplier circuitry, and to VCO 6 by a buffer amplifier 8 to generate the first output signal having a frequency (e.g., 0.91 MHz) corresponding to the difference between the frequency of the first reference signal multiplied by 1.5 (15.36 MHz here) and the frequency of VCO 6 (16.27 MHz, for example). The second mixer 11 is coupled to the second crystal-controlled oscillator 13 and to the second VCO 7, via a buffer amplifier 12, to generate the second output signal having a frequency (0.91 MHz, for example) corresponding to the difference between the frequency of the second reference signal (e.g., 26.055 MHz) and the frequency of the second VCO 7 (e.g., 26.965).

Switch means are provided as shown to selectively couple mixers 9 and 11 to a phase comparator 4 by way of a programmable or variable frequency divider 3. In the illustrated embodiment, the switch can be four separate switches, $S_1$, $S_2$, $S_3$ and $S_4$, or a single switch with four poles, and switches $S_2$ and $S_4$ are used to selectively couple oscillators 6 and 7 to variable frequency divider and poles $S_1$ and $S_3$ are used to selectively couple the outputs of oscillators 6 and 7 via buffer amplifiers 8 and 12, respectively, to utilization circuitry (not shown) such as the remaining portion of the radio's tuning and/or modulating circuitry. Phase comparator 4 is coupled to crystal oscillator 1, by means of fixed frequency dividers 2a and 2b and to the first or second output signal of programmable frequency divider 3, as selected by switches $S_2$ and $S_4$, for comparing the first reference signal from crystal oscillator 1 and the selected output signal and developing a control signal which varies systematically in accordance with the frequency difference therebetween. The control signal developed by phase comparator 4 is typically a DC voltage which is proportional to the frequency difference although, of course, any other systematic relationship (i.e., inversely proportional, an exponential function, or the like) may be employed without departing from the principles of the present invention. The control signal is applied to both controllable oscillators 6 and 7 by means of a low-pass filter 5 which removes any spurious signals from the control signal. Oscillators 6 and 7 are then responsive to the control signal to generate various oscillation frequencies until the frequency of the selected output signal of the programmable frequency divider 3 is equal to that of crystal oscillator 1, as divided by fixed frequency dividers 2a and 2b. In other words, until both input frequencies to phase comparator 11 and 10 KHz in the illustrated embodiment of the invention. Dividers 2a and 2b may of course be two different outputs of a single divider circuit in IC form.

In the illustrated embodiment of the invention, the output signals of controlled oscillators 6 and 7 are applied to mixers 9 and 11, respectively, by means of buffer amplifiers 8 and 12, respectively. Buffer amplifiers 8 and 12 are provided to isolate the output of oscillators 6 and 7 from the input of mixers 9 and 11, respectively. The output signals of oscillators 6 and 7 may be applied to ultimate utilization circuits (not shown) which are connected at circuit points designated $0_1$ and $O_2$. Such utilization circuits may be the so-called "front-end" or tuning circuitry of a radio receiver or transceiver or the modulation circuitry of a radio transmitter or transceiver. The particular utilization circuits do not form an important part of the present invention and therefore are not described in greater detail. Thus, the output frequency of the illustrated system, taken in the illustrated embodiment at the outputs of the oscillators 6 ad 7 and as selected by switches $S_1$ and $S_3$, has a frequency which corresponds to one of the plurality of frequencies as selected by both programmable frequency divider 3 and the particular mixer output frequency as selected by the switch poles $S_2$ and $S_4$.

In accordance with another aspect of the present invention, a frequency multiplier circuit in the form of a frequency tripler 10 is coupled between the crystal oscillator 1 and the mixer and is responsive to the output of crystal oscillator 1 for applying a signal to mixer 9 which has a frequency that is a corresponding present multiple of the frequency of the crystal oscillator 1. With the frequency multiplier circuit taking the form of the series combination of a divide-by-two divider 2a and a frequency tripler 10, of course, the corresponding preset multiple is one and one-half times the frequency of crystal oscillator 1.

In accordance with another aspect of the invention, a fixed frequency divider circuit 2b is coupled between the crystal oscillator 1 and phase comparator 4 for applying to phase comparator 4 the signal which has a frequency that is a preselected ratio of the frequency of the crystal oscillator. Using such a circuit enables the system to apply a relatively high frequency signal to the mixer 9 and a relatively low frequency to the phase comparator 4, both of which facilitate the operation of the embodiment of the invention shown in the figure. In other words, a phase comparator such as that used for phase comparator 4 generally tends to operate better at lower frequencies and a crystal-controlled oscillator and a mixer such as those employed for oscillator 1 and mixer 9 generally tend to operate better at higher frequencies.

In the preferred embodiment of the invention illustrated in the figure, which is particularly adapted for use in a citizen's band transceiver, significant advantage may be taken by employing voltage controlled oscillators for controllable variable frequency oscillators 6 and 7, with each voltage controlled oscillator having a different oscillation frequency in response to the same control signal, and with the resonant frequency of the crystal controlled oscillator 1 being a frequency approximately equal to the difference in oscillation frequencies of the voltage controlled oscillators. For example, the oscillation frequency of crystal oscillator 1 may be selected and controlled by crystal 1a such that oscillator 1 has a reference frequency of 10.24 megahertz, and voltage controlled oscillators 6 and 7 may be constructed to have oscillation frequencies, for a given channel, of 16.27 megahertz and 26.965 megahertz, respectively, in response to the same control signal from low-pass filter 5. Thus, the difference in oscillation frequencies between voltage controlled oscillators 6 and 7 is 10.695 megahertz which is approximately equal to the 10.24 megahertz frequency of crystal oscillator 1. The comparatively small remaining difference, 0.455 megahertz, corresponds to the commonly-used second IF frequencies in conventional citizen's band transceivers.

For the frequencies discussed immediately above, a mixer 9 is thus responsive to the first reference signal having a frequency of 15.36 megahertz from frequency multiplier 10 and (for a given channel) 16.27 megahertz from oscillator 6. If switch pole $S_2$ is closed (and $S_4$ is thus open), for example, then mixer 9 will beat 16.27 megahertz with 15.36 megahertz to get a difference frequency of 0.91 megahertz. Similarly, mixer 11 will beat 26.965 megahertz (for a given channel) with 26.055 megahertz to get a difference frequency of 0.91 megahertz. In this example, the 26.965 megahertz output frequency of oscillator 7 could be used for transmission; the 16.27 megahertz frequency of oscillator 6, for reception.

Programmable frequency divider 3 is made adjustable so that, by changing its dividing ratio, such as with a channel selector switch (not shown), the oscillation frequencies of oscillators 6 and 7 may be varied to obtain the desired output frequencies at output terminals $O_1$ and $O_2$ for the channel desired.

Thus there has been shown and described a new and improved system for generating a plurality of preselected frequencies in a ratio frequency device. The system employs a relatively simple and inexpensive circuit to generate a number of frequencies, some of which are in widely separated frequency bands such as, for example, the different bands of a multi-band receiver or transmitter, or the local oscillator frequencies required to receive a citizen's band radio frequency signal and those required to modulate a carrier signal for transmission by a citizen's band transceiver or transmitter. Particular advantage is obtained by using two reference frequency sources, two mixers and two voltage-controlled oscillators wherein the oscillator frequency of the first voltage controlled oscillator in response to a given control signal differs from the oscillation frequencies of the second voltage controlled oscillator in response to the same control signal by an amount which is equal to the sum of the frequency (in particular applications of the invention) of the fixed reference signal from a crystal-controlled oscillator and the receiver's intermediate frequency signal. With the present invention, the generation of spurious signals, particularly during transmission, are significantly reduced, and they are so reduced without the need of special filtering.

While particular embodiments of the invention have been shown and described in detail, it will be obvious to those skilled in the art that changes and modifications of the present invention, in its various aspects, may be made without departing from the invention in its broader aspects, some of which changes and modifications being matters of routine engineering or design and others being apparent only after study. As such, the scope of the invention should not be limited by the particular embodiment and specific construction described herein but should be defined by the appended claims, and equivalents thereof. Accordingly, the aim in the appended claims is to cover all such changes and modifications as fall within the true spirit and scope of the invention.

The invention is claimed as follows:

1. A system for generating a plurality of preselected frequencies in a radio frequency device, comprising: means for generating a first reference signal having a predetermined frequency; means for generating a second reference signal having a predetermined frequency; means, including first and second controllable variable-frequency oscillators, first and second mixers, and a programmable frequency divider, for generating first and second output signals, with said first mixer being coupled to said first reference signal generating means and to said first variable-frequency oscillator to generate said first output signal having a frequency corresponding to the difference between the frequency of said first reference signal and the frequency of said first variable-frequency oscillator, and with said second mixer being coupled to said second reference signal generating means and to said second variable-frequency oscillator to generate said second output signal having a frequency corresponding to the difference between the frequency of said second reference signal and the frequency of said second variable-frequency oscillator; switch means; means coupled to said first reference signal generating means and selectively coupled to said first and second mixers by said switch means and said programmable frequency divider and selectively responsive to said first and second output signals for selectively comparing said first reference signal with said first output signal and said first reference signal with said second output signal and developing a corresponding control signal which varies systematically in accordance with the frequency difference therebetween, with said control signal being applied to both said controllable variable-frequency oscillators to vary the oscillation frequencies thereof until the frequency of the selected output signal is substantially equal to the predetermined frequency of said first reference signal, whereby the output signal of the corresponding controllable oscillator has a frequency which corresponds to one of the plurality of predetermined receiver frequencies as selected by both the programmable frequency divider and the mixer output signal selected by the switch.

2. A system in accordance with claim 1 which further includes a frequency multiplier circuit coupled between said first reference signal generating means and said mixer, said frequency multiplier circuit being responsive to said first reference signal for applying a signal to said mixer which has a frequency that is a corresponding preset multiple of the frequency of said first reference signal.

3. A system in accordance with claim 2 in which said frequency multiplier circuit comprises the series combination of a divide-by-two divider and a frequency tripler, whereby the frequency of the signal applied to said first mixer from said circuit is one and one-half times the frequency of said first reference signal.

4. A system in accordance with claim 1 which further includes a frequency divider circuit coupled between said first reference signal generating means and said comparing means for applying to said comparing means a signal which has a frequency that is a preselected ratio of the frequency of said first reference signal.

5. A system in accordance with claim 1 in which said first reference signal generating means each comprise a crystal-controlled oscillator, said first and second controllable variable frequency oscillators each comprise a voltage controlled oscillator each having a different oscillation frequency in response to said control signal, with the resonant frequency of said crystal-controlled oscillator being a frequency approximately equal to the difference in oscillation frequencies of said voltage controlled oscillators.

6. A system in accordance with claim 1, in which said radio frequency device utilizes a predetermined intermediate frequency and said controllable oscillators are voltage controlled oscillators, the oscillation frequency of one of said voltage controlled oscillators in response to said control signals differing from the oscillation frequency of the other voltage controlled oscillator in response to said control signal by an amount which is equal to the sum of the frequency of said first reference signal and said intermediate frequency signal.

* * * * *